United States Patent
Milyavsky

(10) Patent No.: US 11,910,518 B2
(45) Date of Patent: Feb. 20, 2024

(54) METHOD AND APPARATUS FOR HEAT SINK MOUNTING

(71) Applicant: Matthew Milyavsky, Ottawa (CA)

(72) Inventor: Matthew Milyavsky, Ottawa (CA)

(73) Assignee: HUAWEI TECHNOLOGIES CANADA CO., LTD., Kanata (CA)

(*) Notice: Subject to any disclaimer, the term of this patent is extended or adjusted under 35 U.S.C. 154(b) by 0 days.

(21) Appl. No.: 17/331,500

(22) Filed: May 26, 2021

(65) Prior Publication Data
US 2022/0386448 A1    Dec. 1, 2022

(51) Int. Cl.
*H05K 1/02*    (2006.01)

(52) U.S. Cl.
CPC ........... *H05K 1/0204* (2013.01); *H05K 1/021* (2013.01)

(58) Field of Classification Search
CPC ............ H05K 7/20154; H05K 7/2039; H05K 7/20454; H05K 7/20472; H05K 7/2049; H05K 7/205; H05K 7/2058; H05K 7/20509; H05K 7/2089–209; H05K 1/0201–0212; H05K 1/021; H05K 1/029; H05K 2201/06–068; H05K 2201/10416; H01L 23/367; H01L 23/40–4006; H01L 23/4093; H01L 23/4081; H01L 23/4087; H01L 23/4043; H01L 2023/4043; H01L 2023/4037; H01L 2023/405; H01L 2023/4062; H01L 2023/4075–4087; G06F 1/20; G06F 1/203; G01R 1/0458; F16B 21/00
See application file for complete search history.

(56) References Cited

U.S. PATENT DOCUMENTS

| | | | |
|---|---|---|---|
| 5,216,283 A * | 6/1993 | Lin | H01L 23/4334 257/796 |
| 5,710,459 A * | 1/1998 | Teng | H01L 23/10 257/E23.105 |
| 5,814,535 A * | 9/1998 | Shimada | H05K 3/363 438/106 |
| 5,945,736 A | 8/1999 | Rife et al. | |
| 6,035,523 A * | 3/2000 | McNeil | H05K 3/305 257/718 |
| 6,061,240 A | 5/2000 | Butterbaugh et al. | |
| 6,390,182 B1 * | 5/2002 | Sauer | H01L 21/4882 257/E23.084 |

(Continued)

FOREIGN PATENT DOCUMENTS

| | | |
|---|---|---|
| CN | 101359604 A | 2/2009 |
| CN | 109588023 A | 4/2019 |
| WO | 2009052761 A1 | 4/2009 |

OTHER PUBLICATIONS

Kam, D. G. et al. "Organic Packages with Embedded Phased-Array Antennas for 60-GHz Wireless Chipsets" IEEE Transactions on Components, Packaging and Manufacturing Technology, vol. 1, No. 11 Nov 2011.

*Primary Examiner* — Amir A Jalali

(57) ABSTRACT

A method is disclosed of mounting a heat sink through a printed circuit board to reach a component on the opposite side of a board. The heat sink is passed through a window in the board to contact a component at a predetermined pressure optimized for thermal performance at minimum stress. The heat sink is affixed in place on the printed circuit board using through-hole pins which can be soldered to maintain the heat sink's position and the predetermined pressure.

17 Claims, 8 Drawing Sheets

(56) References Cited

U.S. PATENT DOCUMENTS

| | | | |
|---|---|---|---|
| 7,903,411 B2* | 3/2011 | Campbell | H01L 23/4093 165/80.4 |
| 2001/0055198 A1* | 12/2001 | Park | H01L 23/4006 257/E23.084 |
| 2004/0124517 A1* | 7/2004 | Hsieh | H01L 23/42 257/E23.087 |
| 2005/0077614 A1* | 4/2005 | Chengalva | H01L 23/42 257/E23.087 |
| 2005/0117296 A1* | 6/2005 | Wu | H01L 23/4093 174/16.3 |
| 2006/0158857 A1* | 7/2006 | Luckner | H01L 23/42 257/E23.087 |
| 2007/0211445 A1* | 9/2007 | Robinson | H01L 23/552 361/818 |
| 2008/0130242 A1 | 6/2008 | Hsieh | |
| 2009/0116194 A1* | 5/2009 | Matsushiba | H01L 23/13 361/709 |
| 2010/0000766 A1* | 1/2010 | Loiselet | H05K 1/0203 29/830 |
| 2010/0309635 A1* | 12/2010 | Sasaki | H05K 1/0204 257/E23.083 |
| 2014/0262449 A1* | 9/2014 | Gektin | H01L 23/4006 29/825 |
| 2014/0268580 A1* | 9/2014 | Mass | B23K 1/0016 361/720 |
| 2015/0084182 A1* | 3/2015 | De Cecco | H01L 23/4093 438/122 |
| 2015/0144321 A1 | 5/2015 | Kim et al. | |
| 2017/0231122 A1 | 8/2017 | Kurz et al. | |
| 2018/0098414 A1* | 4/2018 | Davare | H05K 1/0206 |
| 2018/0158755 A1* | 6/2018 | Ritter | H01L 23/4093 |
| 2019/0189531 A1 | 6/2019 | Nuttall | |
| 2019/0254157 A1* | 8/2019 | Kotlar | H05K 7/205 |
| 2019/0377392 A1 | 12/2019 | Mani et al. | |
| 2022/0029361 A1* | 1/2022 | Braun | H01R 12/585 |

\* cited by examiner

METHOD AND APPARATUS FOR HEAT SINK MOUNTING

TECHNICAL FIELD

The present disclosure relates generally to integrated circuit packaging and assembly, and in particular embodiments, to heat sinks and methods of mounting them through-board with low thermal pad stress.

BACKGROUND

One of the chief functions of integrated circuit (IC) packaging is the transport of heat dissipated by the active circuitry in the IC die. Heat must be carried away either through the printed circuit board (PCB) substrate to which the IC is attached or through the ambient air. Lead-frame based packages contain a die pad, often made of copper, which provides both a ground plane and a heat conductive pathway to the circuit board. Surface-mount packaging technologies, such as Ball Grid Array, rely on heat transfer through solder bumps to an interposer substrate, then through solder balls to the PCB.

Heat sinks are required for ICs that dissipate too much heat to be conducted away through the package surface area into the surrounding air or through the electrical/mechanical connection to the PCB. Heat sinks provide a large thermal mass with an accompanying large surface area, lowering the temperature of the assembly at a given power dissipation rate, and allowing for faster heat exchange with the ambient air due to large surface area features. In order for heat sinks to work properly, there must be a reasonably thermally conductive pathway between the heat sink and the IC package, and ideally, between the heat sink and the IC die. Because heat sinks must have high stiffness to ensure mechanical integrity of heat exchange fins, and because they require high thermal conductivity, they are almost exclusively made of metals.

A radio-frequency IC such as a Monolithic Microwave Integrated Circuit (MMIC) often contains an antenna integrated into the package. This antenna must be free of RF shielding obstructions in order to transmit and receive. In the case where the die is flip chip mounted onto a Ball Grid Array (BGA) substrate for connection to a PCB, and the antenna is integrated facing away from the PCB, a bulk metal heat sink overlying the package would act as an RF shield, severely hampering the functionality of the antenna. Such MMICs therefore require the heat sink to be mounted from the opposite side of the PCB as that to which the MMIC is mounted. This arrangement may be referred to as through-board heat sinking.

Currently this may be accomplished through an arrangement illustrated in FIG. 1A. An assembly 100 is pictured comprising an integrated circuit (IC) die 103 mounted to a PCB substrate 101 via connection posts 104. A machined heat sink 105 is mounted (adhesively or otherwise) to the PCB 101. Part of the heat sink approaches the IC die 103 through a window 102 in the PCB 101. A thermal pad 106 spans the remaining gap distance 116 between the heat sink 105 and the IC package 103. Such pads 106 may comprise a tacky adhesive, an elastomeric binder material, and fragments of a thermal conductor such as boron nitride, silver, graphite, or any other thermally conductive powder suitable for filling an elastomeric binder. Another arrangement for through-board heat sinking is described in "Organic Packages with Embedded Phased-Array Antennas for 60-GHz Wireless Chipsets," authored by IBM and published in IEEE TRANSACTIONS ON COMPONENTS, PACKAGING AND MANUFACTURING TECHNOLOGY, VOL. 1, NO. 11, NOVEMBER 2011. Thermal conduits are opened through the PCB to reach the IC, and thermal gel is applied into the conduits before the heat sink is mounted on the reverse side from the IC.

Each of these approaches has distinct disadvantages. FIG. 1B illustrates the mechanical and machining tolerances involved in determining the gap to be bridged by thermal interface material (TIM) between the heat sink and the IC. The heat sink 105 experiences a hard stop where it contacts PCB 101. The remaining gap 116 between heat sink 105 and integrated circuit 103 is to be filled by a thermal pad material 106. The actual distance of remaining gap 116 to be spanned is subject to the manufacturing tolerances of heat sink step depth 115, PCB thickness 111, and BGA standoff distance 114. Thermal pad material 106 is applied as a sheet which will be under a variable amount of compressive stress depending on the actual remaining gap distance 116. To avoid excessive stress on the package 103, its mounting connections 104, and PCB 101, the remaining gap 116 must be designed fairly large to accommodate acceptable stress levels in the pad 106 at both the minimum and maximum size of the remaining gap 116.

For example, total tolerances in relative positions of heatsink contact surface and component contact surface in many systems can be up to ±0.5 mm. Thermal pad material 106 should be able to span a remaining gap 116 which varies in thickness by 1 mm. All thermal pads require at least a minimum compression and have high thickness tolerances, so for a typical 2±0.3 mm thermal pad, the gap can range from 1.6 mm (1.7 mm pad with minimal compression) to 0.6 mm (1 mm system tolerances). The pad can be expected to compress from ~6% to over 70%. Resulting pressure on the IC 103 (including BGA balls 104) will reduce reliability of the system.

A large size of remaining gap 116 is detrimental to the thermal conductivity of the assembly, as the thermal conductivity of gap fill materials is poorer than that of heat sinks and dies themselves, and forms a significant portion of the overall thermal resistance. Heat removal performance demands the thickness of gap filler 106 be minimized, but this is currently a tradeoff between acceptable stress, acceptable thermal resistance, and the cost of tighter tolerances to improve control of gap size.

The IBM approach also requires very precise manufacturing and assembly techniques as well as extensive manual labor or elaborate fixtures. The actual contact area of the thermal gel to the IC is not controlled and is practically impossible to verify due to being buried between the IC and the heat sink. The quality of final assembly is unknown; conditions and position of thermal gel cannot be confirmed. The thermal path from the IC to the heat sink might be compromised, and thermal performance might decrease. Even if this method can be done reliably, it is expensive, impractical to apply to production quantities, and still does not guarantee consistent performance due to variability in contact area.

In summary, increased pressure on the IC reduces reliability of the assembly, but improves heat transfer. When the pressure is reduced, heat transfer declines and the IC's internal temperature rises. Selecting a pad which satisfies both requirements is a very challenging task, so the designer usually makes a selection based on the best available combination, but barely meeting each requirement. In addition, softer thermal pads are more difficult to handle during assembly process, so time and cost increase. The quality of the filler is difficult to evaluate and test, so the problems will be exposed only during burn-in and in the field.

It is therefore desired to have a heat sink mounting method that is reliable, low-stress, amenable to automation, not sensitive to manufacturing tolerances, and overcomes various other deficiencies in the above discussed art.

SUMMARY

It is an object of the present disclosure to provide a heat sink mounting method, of particular use for heat sinks, which prevents a compressive stress in a semiconductor component's thermal interface material from depending on manufacturing variations in the dimensions of the semiconductor packaging, circuit board substrate, and heat sink materials. It is another object of the present disclosure to allow control of the compressive stress with greater precision, selecting a minimum value to enable heat transfer from component to heat sink, and enhancing circuit assembly reliability by removing unpredictable large stresses which may cause connections between the IC and circuit board to fail during field use.

It is a technical advantage of the present disclosure that hard-stopping the application of a heat sink on the IC itself rather than on the board allows for precise control of the abutting pressure as well as use of an arbitrarily thin thermal interface material.

According to a first embodiment of the disclosure, a method of mounting to a substrate a heat sink member, in contact with a first component residing on the substrate, comprises inserting mounting pins of the heat sink member coaxially into pin receiving openings of the substrate, the axes of the mounting pins and receiving openings oriented in a first direction; bringing a contact surface of the heat sink member into abutment with the first component at a first pressure, wherein travel of the heat sink member in the first direction is limited solely by contact with the first component; and affixing the mounting pins inside the receiving openings such that contact between the first component and heat sink member at the first pressure is maintained.

According to an aspect of the first embodiment, the first pressure is a predetermined pressure selected to enhance heat transfer characteristics of a thermal interface material interposed between the first component and heat sink member.

According to a further aspect of the first embodiment, the heat sink member is configured to exert zero force directly on the substrate in the direction of insertion while exerting the first pressure on the first component.

According to a further aspect of the first embodiment, the heat sink member is a first heat sink comprising one contiguous metal body.

According to a further aspect of the first embodiment, the thermal interface material is preapplied in a sheet to the heat sink member before abutting the first component.

According to a further aspect of the first embodiment, the thermal interface material is less than 50 microns in thickness.

According to a further aspect of the first embodiment, the thermal interface material is a thermal grease, phase change material, thermal gel, or thermal epoxy.

According to a further aspect of the first embodiment, the thermal interface material is a gap filling thermal pad, and the first pressure causes a compression of the gap filling thermal pad.

According to a further aspect of the first embodiment, the contiguous metal body consists essentially of copper or aluminum.

According to a further aspect of the first embodiment, the contiguous metal body is formed from stamped sheet metal.

According to a further aspect of the first embodiment, the contiguous metal body is formed by casting, cold forging, and/or machining.

According to a further aspect of the first embodiment, the contiguous metal body is configured to be fastened to a second bulk heat sink.

According to a further aspect of the first embodiment, the mounting pins are integral to the contiguous metal body.

According to a further aspect of the first embodiment, the fastening to a second bulk heat sink comprises fastening using screws or a barb coupling.

According to a further aspect of the first embodiment, the affixing the mounting pins inside the pin receiving openings is by soldering.

According to a further aspect of the first embodiment, bringing a contact surface of the heat sink member into abutment with the first component is through an access opening provided in the substrate.

According to a further aspect of the first embodiment, contacting the heat sink member to the first component through an access opening in the substrate prevents the heat sink member from shielding RF transmissions in or out of the first component.

According to a further aspect of the first embodiment, the first component is joined to the substrate via a Ball Grid Array, and the affixing the mounting pins inside the pin receiving openings creates a load-bearing path which redirects loads placed on the contiguous metal body away from the Ball Grid Array and into the substrate.

According to a second aspect of the present disclosure, a circuit board assembly is provided comprising a substrate having a first surface and a second surface substantially parallel thereto, the substrate having an access opening therein spanning in a first direction from the second surface to the first surface of the circuit board substrate; an integrated circuit, aligned with and covering at least a portion of the access opening, joined mechanically and electrically to the first surface of the substrate; a contiguous metal body, a contact interface surface of the contiguous metal body passing in the first direction through the access opening to abut the integrated circuit via a thermal interface material substantially along the contact interface surface; and mounting pins inserted along the first direction into pin receiving openings through the second surface of the substrate to hold the contiguous metal body in position relative to the substrate; wherein the extent of an incursion of the contiguous metal body in the first direction is determined by its abutment to the integrated circuit, and wherein the mounting pins are affixed into the pin receiving openings to maintain the contiguous metal body in contact with the integrated circuit via the thermal interface material.

According to a third aspect of the present disclosure, a circuit board assembly is provided comprising a substrate having a first surface and a second surface substantially parallel thereto; an integrated circuit joined mechanically and electrically to the first surface of the substrate; a contiguous metal body, a contact interface surface of the contiguous metal body abutting the integrated circuit via a thermal interface material substantially along the contact interface surface; mounting pins inserted in a first direction into pin receiving openings through the first surface of the substrate to hold the contiguous metal body in position relative to the substrate; wherein the extent of an incursion of the contiguous metal body in the first direction is determined by its abutment to the integrated circuit; and wherein the mounting pins are affixed into the pin receiving openings to maintain the contiguous metal body in contact with the integrated circuit via the thermal interface material.

BRIEF DESCRIPTION OF THE DRAWINGS

For a more complete understanding of the present embodiments, and the advantages thereof, reference is now made, by way of example, to the following descriptions taken in conjunction with the accompanying drawings, in which.

DETAILED DESCRIPTION OF ILLUSTRATIVE EMBODIMENTS

For illustrative purposes, specific example embodiments will now be explained in greater detail below in conjunction with the figures.

The embodiments set forth herein represent information sufficient to practice the claimed subject matter and illustrate ways of practicing such subject matter. Upon reading the following description in light of the accompanying figures, those of skill in the art will understand the concepts of the claimed subject matter and will recognize applications of these concepts not particularly addressed herein. It should be understood that these concepts and applications fall within the scope of the disclosure and the accompanying claims.

Various embodiments disclosed herein may contain features described individually or in combination. It will be appreciated that features disclosed in one embodiment may be combined with features disclosed in a further embodiment without departing from the scope of the disclosure.

Figure 2:
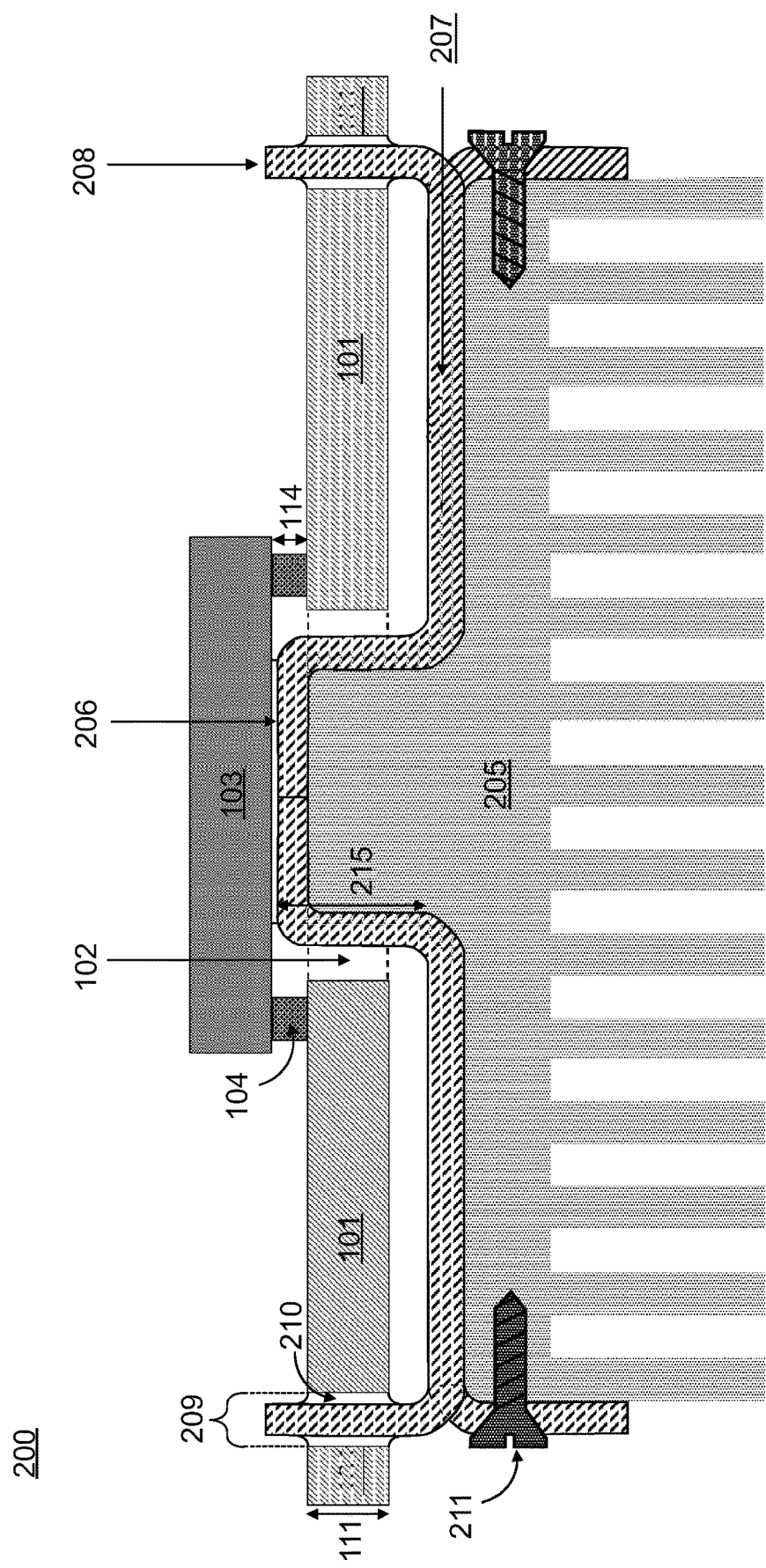
FIG. 2 is a cross-sectional view of a stamped metal heat sink with through-hole mounting pins, and a bulk finned heat sink attached using screws, according to an embodiment of the present invention.

With reference to FIG. 2, an assembly 200 is pictured comprising an integrated circuit 103 mounted to a PCB substrate 101 via connection posts 104. PCB substrate 101 may be constructed of, for example, an epoxy-impregnated fiber weave such as FR-4 and be laminated with various layers including copper traces, interlevel dielectrics, solder mask, and silkscreen. The PCB provides mechanical rigidity to an assembly and pathways to interconnect terminals of components attached thereto. When manufactured, its thickness, may vary +/−10% from the nominal value.

An access opening 102 is cut or otherwise formed in the PCB so that a heat sink member comprising a contiguous metal body 207 may contact the IC from the opposite side of the PCB to which the IC is mounted. In one embodiment, the heat sink is not mounted above IC 103 if it would interfere with RF transmissions in or out of IC 103. The opening size can allow for sufficient overlap between the IC 103 and the substrate 101 so that all required electrical contacts 104 may be made between IC 103 and substrate 101.

Further referring to FIG. 2, connection posts 104 may comprise, by way of non-limiting examples, solder balls, leadframe leads, surface mount lands, pins, or copper pillars to provide a mechanical and electrical connection between IC 103 and PCB 101. Many of these surface-mount or through-hole technologies require an amount of solder to make connection to a PCB. Solder mounting involves heating the solder above its solidus temperature and deforming it so that it flows and makes intimate contact with mating surfaces of the IC and PCB before cooling below the solidus temperature. The final distance 114 between PCB and IC is subject to variation based on the repeatability of the heating and deforming process.

Contiguous metal body 207 forms the interface of a heat sink with PCB 101 and IC 103. In some embodiments, contiguous metal body 207 may be formed from sheet metal comprising a copper or aluminum alloy and shaped by a stamping process. Die stamping forms in the sheet metal a step height 215 of at least the PCB thickness 111 plus the connection post height 114 plus a margin, preferably significantly more than the sums of the tolerances in PCB thickness 111, connection post thickness 114, and heat sink step height 215. Step height 215 serves to create a portion of contiguous metal body 207 which may be passed through access opening 102 to make thermal contact with IC 103. In this or a subsequent stamping operation, some of the sheet metal may be bent to form mounting pins 208 which are placed to mate with receiving openings 209 drilled or otherwise formed in PCB 101. Such receiving openings may also be known in the art as plated through-holes.

The condition of the thermal contact interface between contiguous metal body 207 and IC 103 is of prime importance. If placed in direct contact, contiguous metal body 207 and IC 103 would have an irregular air gap present between them, owing to microscopic surface imperfections preventing full planar contact. Thus a thermal interface material 206 is interposed between them to fill the gap and eliminate the thermal resistance caused by air in the contact. The thermal interface material 206 in some embodiments may be preapplied to the heat sink (e.g. in a sheet), and in others may be applied to the IC package first.

Figure 1A:
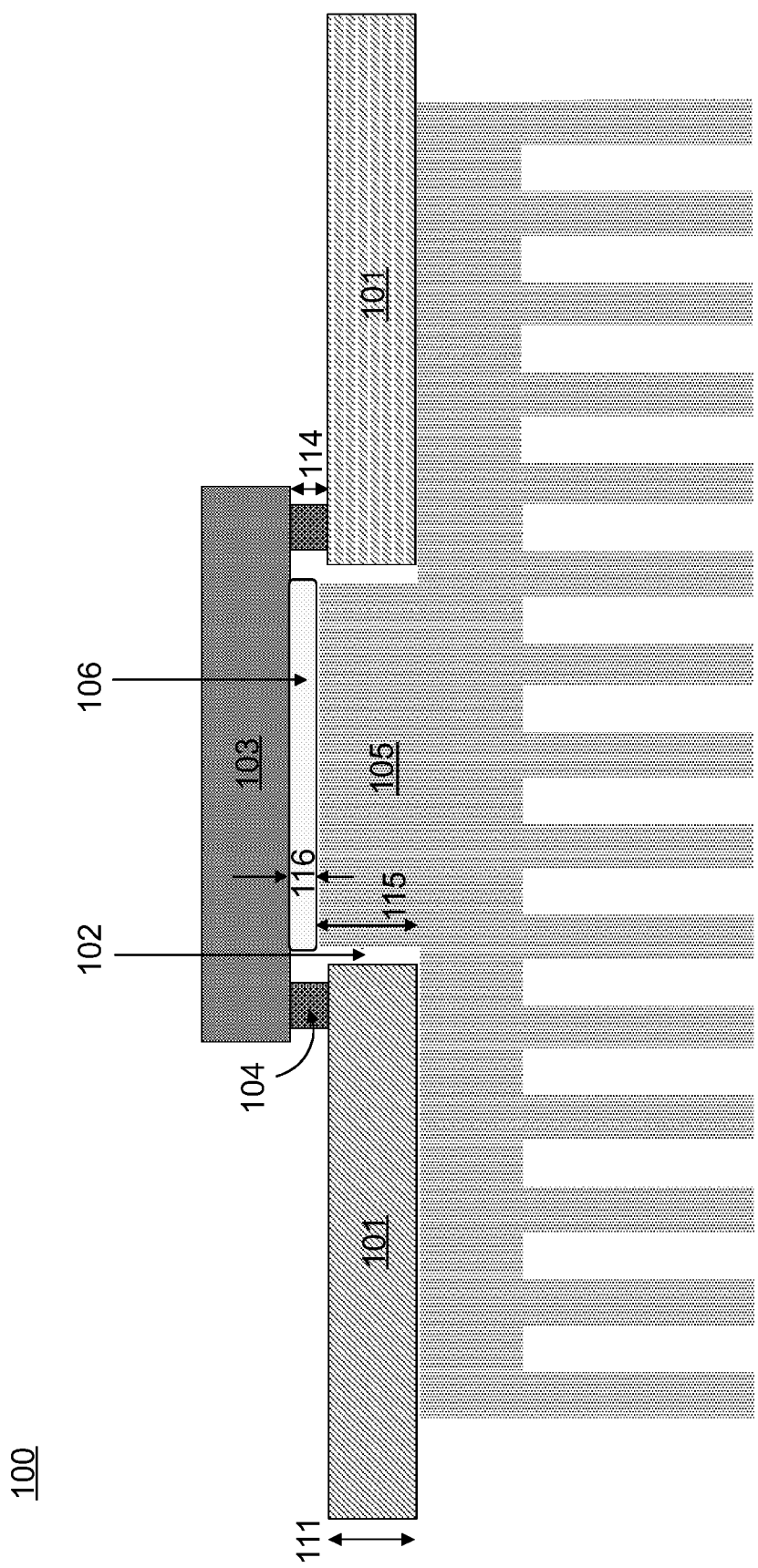
FIG. 1A is a cross-sectional view of a prior art heat sink which is hard-stopped on a PCB substrate.
Figure 1B:
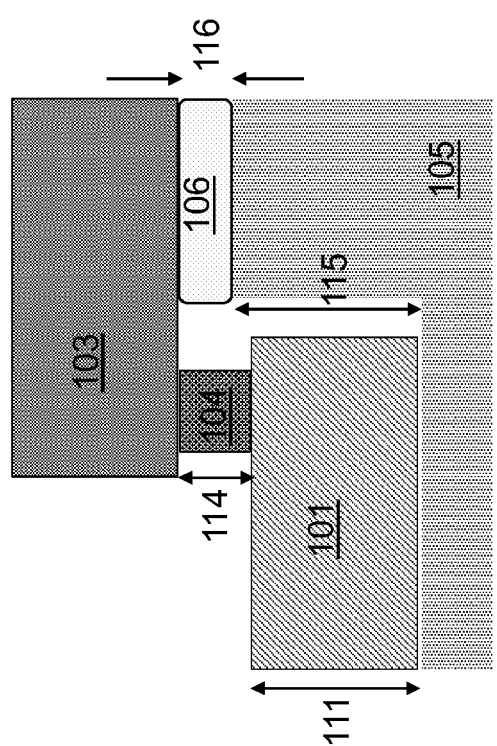
FIG. 1B is an inset view of the mechanical manufacturing tolerances that influence the gap variability between the heat sink and integrated circuit.

In the prior art, the remaining gap thickness (see FIG. 1B) 116 of gap fill 106 had to be made sufficiently thick to allow for varying stress, under compression, confined by dimensions which vary according to manufacturing tolerances of PCB substrates 111, solder reflow 114, and even the thickness tolerance of the gap fill pad itself. This was because the heat sink was hard stopped against the PCB, forcing the gap to vary with PCB and connection post dimensions. However, inserting pins 208 into openings 209 provides alignment without creating a hard stop against the PCB. The contiguous metal body 207 can be abutted against IC 103 at a predetermined pressure regardless of board and solder manufacturing tolerances because the pins are free to slide into the openings whatever distance necessary to compensate for the tolerances. The metal body thus exerts zero force on the PCB while being brought into contact with the IC. It is a technical advantage of the present invention that hard-stopping the insertion of contiguous metal body 207 through window 102 where it abuts IC 103 allows for precise control of the abutting pressure as well as use of an arbitrarily thin thermal interface material 206. Advantageously, thermal interface materials of under 50 microns in thickness are possible due to eliminating the gap dependence on manufacturing tolerances.

The abutting pressure is preferably chosen according to a minimum value needed for satisfactory thermal contact when using a given thermal interface 206. Choosing the minimum pressure affords the technical advantage of improving the reliability of the assembly, as it reduces stress on IC 103 and its connection posts 104. In the case of compressible gap-filling thermal pads comprising an elastomer (e.g. silicone) and a heat conductive filler powder (e.g. graphite, silver), the pressure is selected to produce a predetermined deflection or compression in the thermal pad. Compression of approximately 10% is considered sufficient for thermal conductivity when using most of these materials. Alternatively, thermal interface 206 could comprise a thin layer of thermal grease, phase change material, thermally conductive powder filled epoxy, thermal gel, a thermal tape, or any other known material which can gap fill the surface irregularities of contiguous metal body 207 and IC 103 while minimally adding to the thermal resistance between IC 103 and contiguous metal body 207.

As referred to in FIG. 2, mounting pins 208 serve to insert into receiving openings 209 in PCB 101 to maintain alignment of contiguous metal body 207 in the plane of the PCB and IC. The position of contiguous metal body 207 along an axis normal to this plane, in a first direction normal to the IC and parallel to the mounting pins and axes of the receiving openings, is set by abutting it to IC 103 at a predetermined pressure and is held constant by affixing mounting pins 208 inside receiving openings 209. In the embodiment of FIG. 2, solder 210 is employed to fix the pins 208 in place. Once cooled and solidified, solder 210 provides the vast majority of mechanical stability of contiguous metal body 207 relative to PCB 101, so that IC 103 and connection posts 104 do not bear loads put on the heat sink. As an option, the solder composition can be chosen according to the metal composition of the mounting pins. Solders used for aluminum generally contain zinc with some lead, cadmium, tin, copper, or aluminum. However, any solder that contains tin may cause an electrochemical corrosion problem due to its galvanic potential. For affixing copper pins, the range of useful solders is much wider including most combinations of In, Sn, Pb, or Ag.

Stamping operations may also form portions of contiguous metal body 207 into a receiving cavity for a bulk metal heat sink 205 composed, in some embodiments, of aluminum or copper. Advantageously, bulk metal heat sink 205 may be cast from a die similar in shape to the die that forms the heat sink-facing surface of contiguous metal body 207 so that there is an intimate fit between contiguous metal body 207 and bulk heat sink 205. In some embodiments, bulk metal heat sink 205 may be affixed to contiguous metal body 207 using screws 211 passing through the sidewalls of the receiving cavity into threaded openings in bulk heat sink 205. The bulk heat sink 205 is optional for many implementations, as the heat transfer out through contiguous metal body 207 may in many cases be sufficient for the application due to the superior thermal conductivity afforded by the thin thermal contact 206. In those cases, stamping operations may be used to form heat radiating fins rather than a receiving cavity with sidewalls designed for screw stability.

Figure 3:
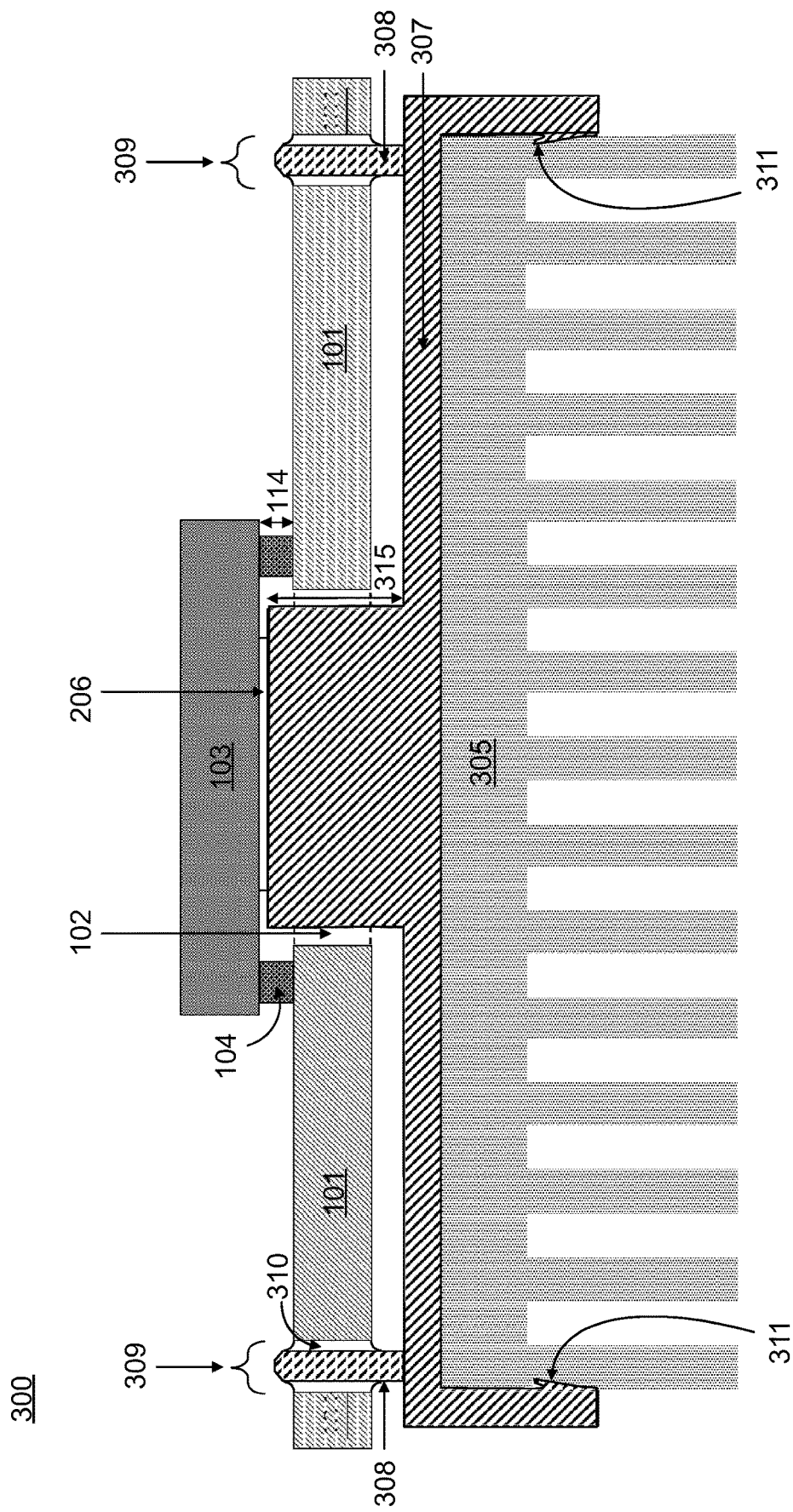
FIG. 3 is a cross-sectional view of a forged or cast heat sink with mounting pins integrally formed and a bulk finned heat sink attached using a barb coupling, according to an embodiment of the present invention.

FIG. 3 illustrates an alternate embodiment of the present invention. An assembly 300 is pictured comprising an integrated circuit (IC) die 103 mounted to a PCB substrate 101 via connection posts 104. Printed circuit board 101, die 103, access opening 102, and die connection posts 104 function as discussed previously, so their functions need not be discussed further. In this embodiment, the contiguous metal body 307 is still inserted through access opening 102 to abut IC 103 via a thermal interface material 206 at a predetermined pressure. Mounting pins 308 are still integral to the contiguous metal body 307 and provide alignment of metal body 307 to access opening 102. Mounting pins 308 are, in similar fashion to FIG. 2, affixed in place by soldering into receiving openings 309 using solder 310.

In the example embodiment of FIG. 3, contiguous metal body 307 may in some embodiments be extruded and machined, or may be formed from a casting or cold forging operation which simultaneously shapes mounting pins 308, heat sink step height 315, and the receiving cavity for holding bulk metal heat sink 305 using barb couplings 311, or thermal fins in embodiments in which bulk metal heat sink 305 is not used.

In a barb coupling, one member takes the role of an elastic deformer. The portion of contiguous metal body 307 which extends to form the sidewall of the receiving cavity is capable of elastic deformation upon insertion of a bulk metal heat sink 305. A barb 311 on the interior face of the receiving cavity wall is shaped like a wedge to cause elastic spreading of the wall as heat sink 305 is inserted. The elastic strain on the sidewall is released when barb 311 lines up with the notched edge in heat sink 305. An audible "click" alerts the user that the heat sink is secured into place without the need for a tool such as a screwdriver. It will be appreciated that the barbed sidewall of the receiving cavity can function as a thermal fin in lower heat dissipation applications when bulk metal heat sink 305 is not required. The insertion process is also reversible if means (not shown) are provided to elastically stretch contiguous metal body 307 sufficiently for barbs 311 to be clear of the edge notch.

Figure 4:
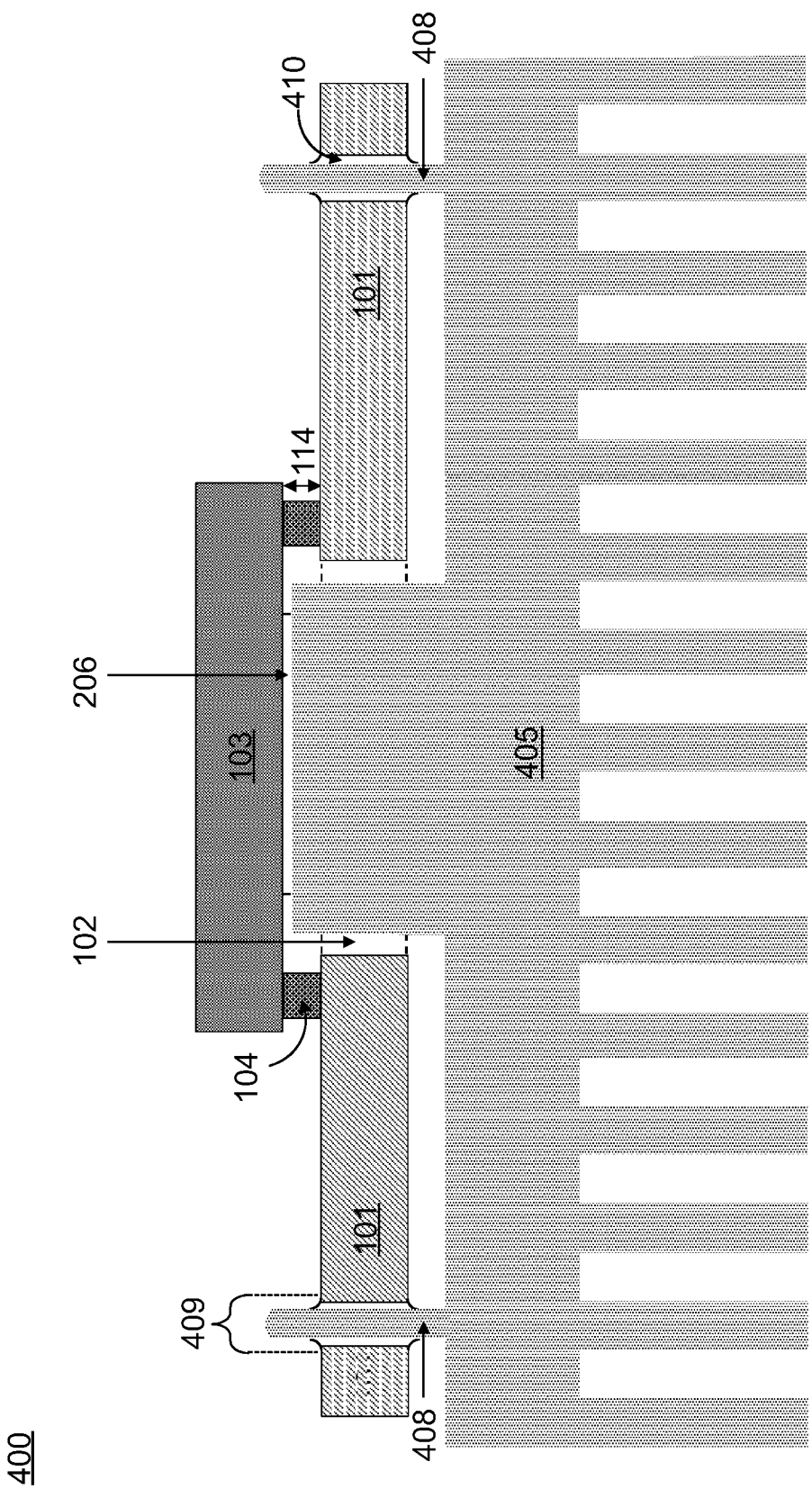
FIG. 4 is a cross-sectional view of a one-piece bulk finned heat sink, attached to the PCB substrate using soldered integral mounting pins, and hard-stopped to the integrated circuit without an intermediate metal body, according to an embodiment of the present invention.

FIG. 4 illustrates, according to a further embodiment, further simplification of the heat sink construction. A heat sink, PCB, and IC assembly 400 is provided. For applications for which the contiguous metal body alone is never sufficient to remove all the heat from the IC, a single piece heat sink 405 takes on the role of both contiguous metal body contact and bulk finned heat sink. Single piece heat sink 405, which can, by way of non-limiting example be cast, cold forged, extruded, and/or machined, can be affixed to PCB 101 using integral mounting pins 408 inserted into receiving openings 409. Alternatively, machine pins (not shown) can be attached to heat sink 405 in place of integrally formed pins 408 and be affixed to receiving openings 409 using solder 410. As in previously mentioned embodiments, no matter the composition or manufacturing method of the heat sink, the critical part of the assembly method is abutting the heat sink 405 to the IC 103 via thermal interface material 206 using only enough force to form thermal contact, and subsequently soldering the mounting pins in place, thus providing rigid support for the heat sink/PCB joint and minimizing stress load from heat sink 405 on IC 103 or the members 104 used to connect it to the PCB 101.

Figure 5:
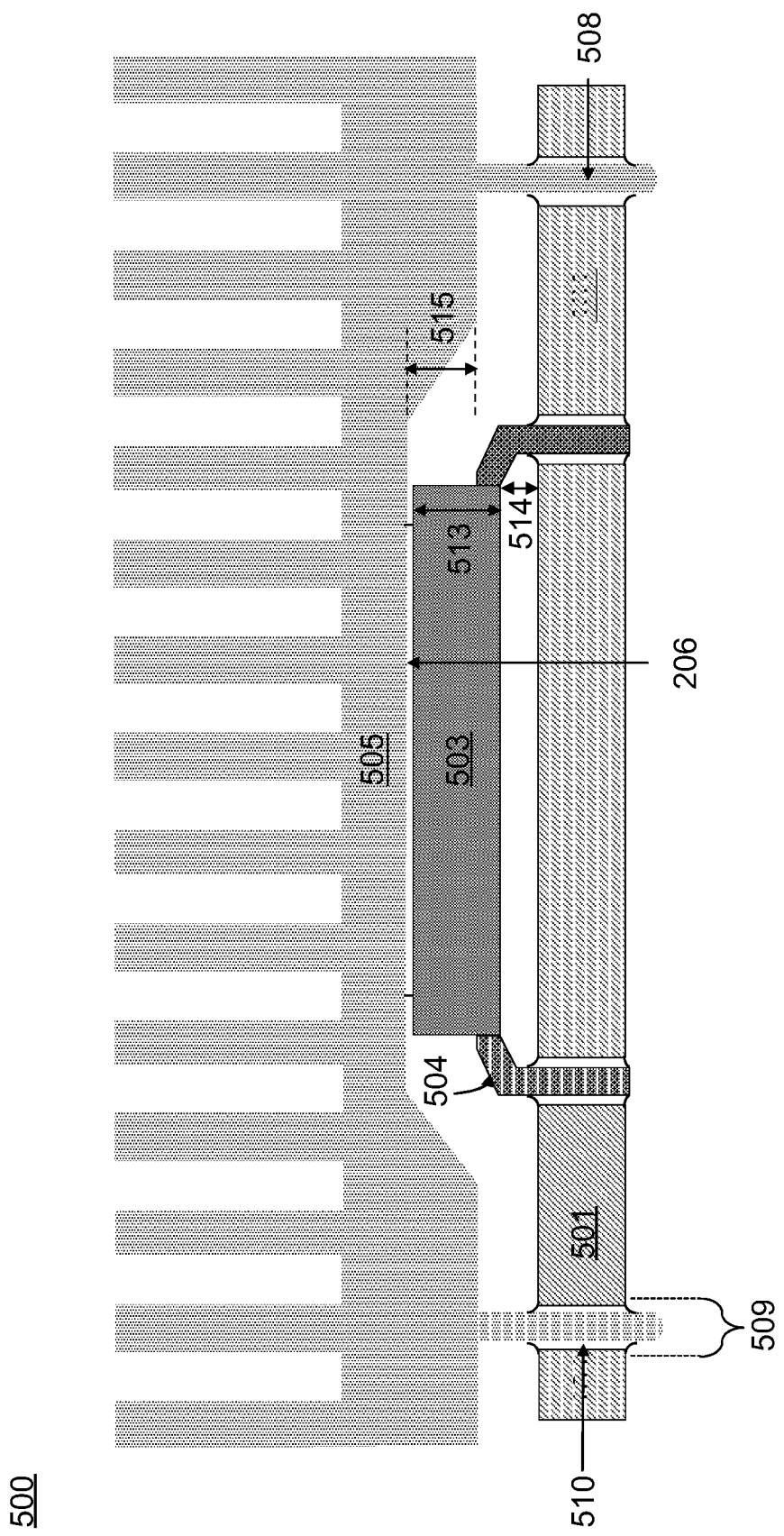
FIG. 5 is a cross-sectional view of a one-piece bulk finned heat sink, attached to the PCB substrate topside using soldered integral mounting pins, and hard-stopped to the integrated circuit without an intermediate metal body, according to an embodiment of the present invention. This heat sink is configured to transfer heat out of the top side of a TSOP or other through-hole package.

The embodiment pictured in FIG. 5 is another embodiment directed to ICs which may have heat sinks mounted on the top side of the package in addition to those which must mount the heat sink underneath. While MMICs and other radio-frequency ICs with copackaged antennas must allow for unshielded transmission, any other IC requiring a heat sink can also benefit from the technical advantages of the present invention. Top side in this application refers to the side of a circuit board to which the first component of interest is attached.

With reference to FIG. 5, board assembly 500 comprises general IC 503 which does not necessarily contain a transmitting/receiving antenna. It is joined to general circuit board 501 which is not equipped with any access opening to reach the backside of IC package 503. IC 503 is mounted using a general board population technology, which may or may not be surface mount. The non-limiting example of a lead frame TSOP is illustrated, with leads 504 soldered into plated through-holes in circuit board 501, leaving a standoff distance 514 between the IC 503 and PCB 501. Variations in die encapsulation mold size, lead frame bend angle, and performance of IC insertion equipment may give rise to variations in standoff distance 514, IC encapsulation thickness 513. These unknown dimensions cannot be adequately predicted and compensated by the heat sink step height 515 during the manufacture of bulk metal heat sink 505, which may be manufactured by any of the aforementioned metalworking methods.

In contrast to previously mentioned embodiments, heat sink 505 may be provided with a cavity to fit over IC 503 rather than a protrusion to insert into an access opening. However, even from the topside of the PCB 501, heat sink 505 can be brought into abutment with IC 503 at a preselected pressure suitable to create an optimal thermal interface using thermal interface material 206. The designed thickness of thermal interface material 206 need not take into account any of the dimensions 513, 514, or 515 because pins 508 can insert into receiving openings 509 any distance which is required to achieve a hard stop of heat sink 505 on IC 503. Solder 510 is then applied to affix heat sink 505 in position over and in contact with IC 503 via interface material 206 permanently at the preselected pressure.

Figure 6:
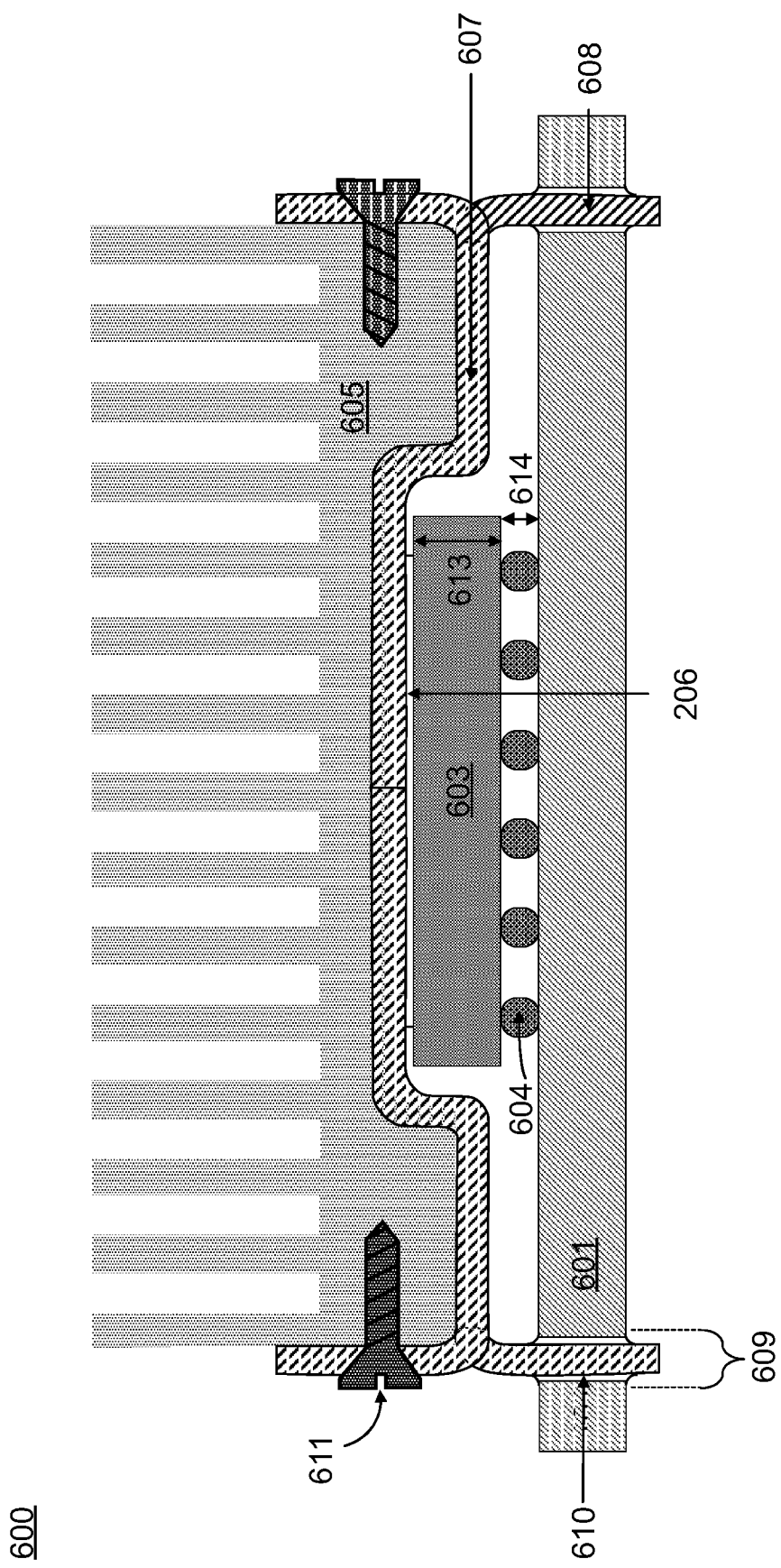
FIG. 6 is a cross-sectional view of a stamped sheet metal heat sink applied to the topside of the PCB substrate with through-hole mounting pins, and a bulk finned heat sink attached using screws, according to an embodiment of the present invention. This heat sink is configured to transfer heat out of the top side of a BGA or other surface mount package.

A further example of an embodiment utilizing topside heat sinking is described in FIG. 6. Board assembly 600 comprises an integrated circuit 603 in a BGA package, joined to substrate 601 via solder ball grid array 604, each solder ball exhibiting a height 614. As BGAs are particularly sensitive to both shear stresses and stresses normal to the solder balls, the present invention is particularly beneficial to assemblies involving BGA packages. Contiguous metal body 607 is brought into contact with BGA IC 603, the thermal interface mitigated, as in other embodiments, by thermal interface material 206. A light pressure, just enough to fully enable heat transfer through interface material 206, is used to contact the components, which increases reliability by lowering stress on the solder ball array. Simultaneously, mounting pins 608 enter pin receiving openings 609 in substrate 601 from the top side. With the contiguous metal body held in place, solder 610 is applied to create a strong reinforcement, in other words a load bearing path, relieving ball grid array 604 of external stresses caused by the weight and inertia of the heat sink or mechanical shocks that may strike the assembly during handling and use. Optional bulk heat sink 605 is shown joined to receiving cavity sidewalls by screws 611, though in this and other embodiments a barb coupling or other fastener known to those skilled in the art may be used as an alternative means of joining bulk heat sink 605 to contiguous metal body 607.

Figure 7:
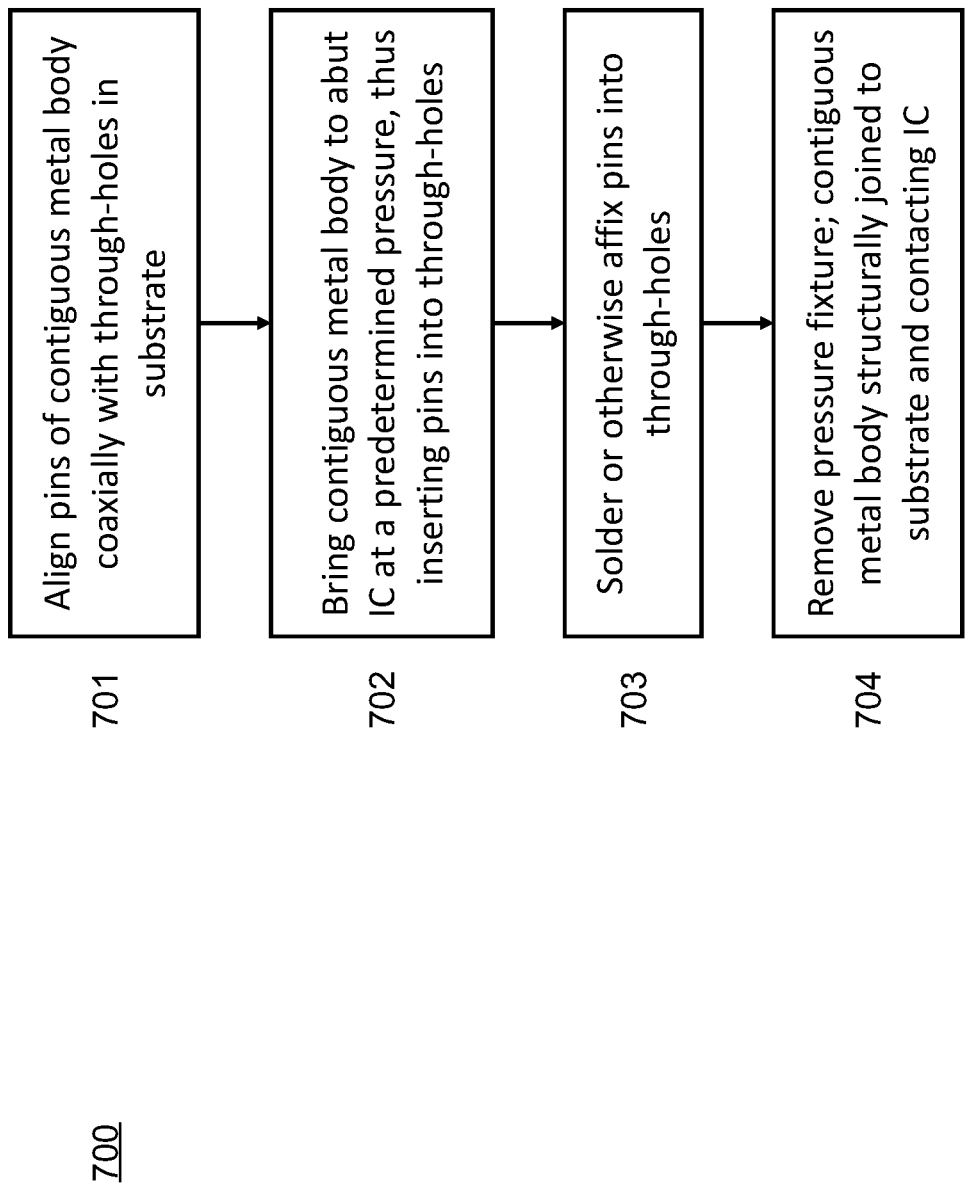
FIG. 7 is a flowchart describing the procedure of mounting a contiguous metal body to a substrate in contact with an IC according to an embodiment of the invention.

With reference to FIG. 7, a flowchart 700 describes the method used to mount a heat sink member comprising a contiguous metal body to a circuit board substrate, the contiguous metal body in contact with an IC already attached to the substrate. In step 701, a component placing apparatus may bring the contiguous metal body into alignment with a circuit board substrate, the alignment being a coaxial alignment of pins on the contiguous metal body with pin receiving openings (plated through-holes) on the substrate. The through-holes are machined in locations that match up with the locations of pins on a heat sink design. In step 702, the component placing apparatus translates the contiguous metal body along the pin and through-hole axial direction. The pins enter the pin receiving openings at a point in time before the contiguous metal body makes contact with the IC via a thermal interface material. The contiguous metal body ceases moving relative to the IC when it abuts against the IC, but there is no force exerted on the contiguous metal body by the substrate itself. Stated another way, the contiguous metal body hard stops on the IC. In step 703 a solder, glue, epoxy, or other filling and joining material is introduced into the through-holes to form a strong mechanical bond between the contiguous metal body and the substrate. In step 704, the component placing apparatus withdraws from the contiguous metal body. The mechanical bond is capable of maintaining the position of the heat sink as well as its pressure on the IC. A key function of this mechanical bond is to bear shear and compressive/tensile stresses exerted between the heat sink and substrate, not allowing destructive levels of strain to damage the electrical attachments between the IC and substrate.

Although a combination of features is shown in the illustrated embodiments, not all of them need to be combined to realize the benefits of various embodiments of this disclosure. In other words, a system or method designed according to an embodiment of this disclosure will not necessarily include all of the features shown in any one of the Figures or all of the portions schematically shown in the Figures. Moreover, selected features of one example embodiment may be combined with selected features of other example embodiments.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of mounting to a substrate a heat sink member in contact with a first component residing on the substrate, the substrate comprising a first surface and a second surface substantially parallel to the first surface, the first component residing on the first surface of the substrate, the method comprising:

inserting mounting pins of the heat sink member coaxially into pin receiving openings of the second surface of the substrate, the axes of the mounting pins and the receiving openings oriented in a first direction;

bringing a contact surface of the heat sink member into contact with the first component at a first pressure, wherein the first pressure is a predetermined pressure selected to enhance heat transfer characteristics of a thermal interface material interposed between the first component and the heat sink member and wherein displacement of the heat sink member in the first direction is determined based on the first pressure; and rigidly affixing the mounting pins inside the receiving openings such that contact between the first component and the heat sink member at the first pressure is maintained, wherein the heat sink member is a first heat sink comprising one contiguous metal body and the mounting pins are integral to the contiguous metal body.

2. The method of claim 1 wherein the heat sink member is configured to exert zero force directly on the substrate in the direction of insertion while exerting the first pressure on the first component.

3. The method of claim 1 wherein the thermal interface material is preapplied in a sheet to the heat sink member before contacting the first component.

4. The method of claim 3 wherein the thermal interface material is a gap filling thermal pad, and the first pressure causes a compression of the gap filling thermal pad.

5. The method of claim 1 wherein the thermal interface material is less than 50 microns in thickness.

6. The method of claim 1 wherein the thermal interface material is a thermal grease, phase change material, thermal gel, or thermal epoxy.

7. The method of claim 1 wherein the contiguous metal body includes copper or aluminum.

8. The method of claim 1 wherein the contiguous metal body is formed from stamped sheet metal.

9. The method of claim 1 wherein the contiguous metal body is formed by casting, cold forging, and/or machining.

10. The method of claim 1 wherein the contiguous metal body is configured to be fastened to a second bulk heat sink.

11. The method of claim 10 wherein the fastening to the second bulk heat sink comprises fastening using screws or a barb coupling.

12. The method of claim 1 wherein the rigidly affixing the mounting pins inside the pin receiving openings is by soldering.

13. The method of claim 1 wherein bringing a contact surface of the heat sink member into contact with the first component is through an access opening provided in the substrate.

14. The method of claim 13 wherein contacting the heat sink member to the first component through the access opening in the substrate prevents the heat sink member from shielding RF transmissions in or out of the first component.

15. The method of claim 1 wherein the first component is joined to the substrate via a Ball Grid Array, and the rigidly affixing the mounting pins inside the pin receiving openings creates a load-bearing path which redirects loads placed on the contiguous metal body away from the Ball Grid Array and into the substrate.

16. A circuit board comprising:
    a substrate comprising a first surface and a second surface substantially parallel to the first surface;
    an integrated circuit residing on the first surface of the substrate and joined electrically to the first surface of the substrate;
    a contiguous metal body, a contact interface surface of the contiguous metal body contacting the integrated circuit at a first pressure via a thermal interface material along the contact interface surface;
    pins, comprising a first pin oriented along a first direction, disposed inside pin receiving openings through the second surface of the substrate, the pins being integral to the contiguous metal body;
    wherein the first pressure is a predetermined pressure selected to enhance heat transfer characteristics of the thermal interface material;
    wherein the extent of an incursion of the contiguous metal body in the first direction is determined based on the first pressure; and
    wherein the pins are rigidly affixed into the pin receiving openings to maintain the contiguous metal body in contact with the integrated circuit via the thermal interface material at the first pressure.

17. The circuit board of claim 16, wherein the substrate comprises an access opening spanning in a first direction from the second surface to the first surface of the substrate;
    wherein the integrated circuit aligns with and covers at least a portion of the access opening, the integrated circuit being joined electrically to the first surface of the substrate;
    wherein the contact interface surface of the contiguous metal body passes in the first direction through the access opening to contact the integrated circuit via the thermal interface material along the contact interface surface; and
    wherein at least one of the pin receiving openings is located adjacent an opposing side of the access opening from at least one other of the pin receiving openings.

* * * * *